United States Patent
Koo et al.

(10) Patent No.: US 9,142,379 B2
(45) Date of Patent: Sep. 22, 2015

(54) ION SOURCE AND A METHOD FOR IN-SITU CLEANING THEREOF

(71) Applicant: Varian Semiconductor Equipment Associates, Inc., Gloucester, MA (US)

(72) Inventors: Bon-Woong Koo, Andover, MA (US); Christopher R. Campbell, Newburyport, MA (US); Craig R. Chaney, Gloucester, MA (US); Robert C. Lindberg, Rockport, MA (US); Wilhelm P. Platow, Newburyport, MA (US); Alexander S. Perel, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/326,321

(22) Filed: Jul. 8, 2014

(65) Prior Publication Data

US 2014/0319369 A1    Oct. 30, 2014

Related U.S. Application Data

(62) Division of application No. 12/533,318, filed on Jul. 31, 2009, now Pat. No. 8,809,800.

(60) Provisional application No. 61/085,943, filed on Aug. 4, 2008.

(51) Int. Cl.
*H01J 27/02* (2006.01)
*H01J 27/14* (2006.01)
*H01J 37/08* (2006.01)
*H01J 37/317* (2006.01)
*H01J 37/30* (2006.01)

(52) U.S. Cl.
CPC ............ *H01J 27/022* (2013.01); *H01J 27/02* (2013.01); *H01J 27/14* (2013.01); *H01J 37/08* (2013.01); *H01J 37/3002* (2013.01); *H01J 37/3171* (2013.01); *H01J 2237/022* (2013.01); *H01J 2237/31705* (2013.01)

(58) Field of Classification Search
CPC ............... H01J 2237/0213; H01J 2237/022; H01J 2237/31705; H01J 27/02; H01J 27/022; H01J 37/08; H01J 37/3002; H01J 37/3171; H01J 237/002; H01J 37/304
See application file for complete search history.

(56) References Cited

U.S. PATENT DOCUMENTS

| | | | | |
|---|---|---|---|---|
| 4,253,026 A | * | 2/1981 | Veach et al. | 250/426 |
| 6,242,719 B1 | * | 6/2001 | Kano et al. | 219/444.1 |
| 6,308,654 B1 | * | 10/2001 | Schneider et al. | 118/723 I |
| 6,875,986 B1 | * | 4/2005 | Murakoshi et al. | 250/424 |
| 7,838,842 B2 | * | 11/2010 | Horsky | 250/423 R |

(Continued)

*Primary Examiner* — Nicole Ippolito
*Assistant Examiner* — Wyatt Stoffa

(57) ABSTRACT

An ion source and method of cleaning are disclosed. One or more heating units are placed in close proximity to the inner volume of the ion source, so as to affect the temperature within the ion source. In one embodiment, one or more walls of the ion source have recesses into which heating units are inserted. In another embodiment, one or more walls of the ion source are constructed of a conducting circuit and an insulating layer. By utilizing heating units near the ion source, it is possible to develop new methods of cleaning the ion source. Cleaning gas is flowed into the ion source, where it is ionized, either by the cathode, as in normal operating mode, or by the heat generated by the heating units. The cleaning gas is able to remove residue from the walls of the ion source more effectively due to the elevated temperature.

11 Claims, 5 Drawing Sheets

(56) References Cited

U.S. PATENT DOCUMENTS

| | | | |
|---|---|---|---|
| 8,188,448 B2* | 5/2012 | Benveniste et al. | 250/492.21 |
| 2002/0081445 A1* | 6/2002 | Kadomura et al. | 428/469 |
| 2003/0218429 A1* | 11/2003 | Kinoyama | 315/111.81 |
| 2006/0284104 A1* | 12/2006 | Fujita et al. | 250/423 R |
| 2007/0023711 A1* | 2/2007 | Fomenkov et al. | 250/504 R |
| 2007/0253686 A1* | 11/2007 | Wendt et al. | 392/388 |
| 2007/0278417 A1* | 12/2007 | Horsky et al. | 250/427 |
| 2008/0067412 A1* | 3/2008 | Vanderberg et al. | 250/427 |
| 2009/0114841 A1* | 5/2009 | DiVergilio | 250/427 |
| 2009/0173888 A1* | 7/2009 | Shichi et al. | 250/397 |
| 2009/0206281 A1* | 8/2009 | Oved et al. | 250/492.21 |
| 2009/0261248 A1* | 10/2009 | Glavish et al. | 250/298 |
| 2009/0283695 A1* | 11/2009 | Horsky et al. | 250/426 |
| 2009/0314951 A1* | 12/2009 | Biloiu et al. | 250/423 R |
| 2010/0025576 A1* | 2/2010 | Adams | 250/288 |
| 2010/0062589 A1* | 3/2010 | Anella et al. | 438/527 |
| 2010/0112795 A1* | 5/2010 | Kaim et al. | 438/515 |
| 2010/0154835 A1* | 6/2010 | Dimeo et al. | 134/31 |
| 2011/0081783 A1* | 4/2011 | Stevenson et al. | 438/710 |
| 2011/0089321 A1* | 4/2011 | Glavish et al. | 250/298 |
| 2011/0240877 A1* | 10/2011 | Benveniste et al. | 250/424 |
| 2011/0259366 A1* | 10/2011 | Sweeney et al. | 134/10 |
| 2012/0048723 A1* | 3/2012 | Chaney | 204/192.11 |
| 2012/0058252 A1* | 3/2012 | Sweeney et al. | 427/58 |
| 2012/0064705 A1* | 3/2012 | Horsky et al. | 438/514 |

\* cited by examiner

ION SOURCE AND A METHOD FOR IN-SITU CLEANING THEREOF

This application is a divisional of U.S. patent application Ser. No. 12/533,318, filed Jul. 31, 2009, which claims priority of U.S. Provisional Patent Application No. 61/085,943, filed Aug. 4, 2008, the disclosures of which are incorporated herein by reference in their entireties.

FIELD

Present disclosure relates to an apparatus for material processing, more particularly, to an ion source of an ion implantation system, and a method of cleaning the ion source.

BACKGROUND

Ion implantation is a type of process that may be performed on, among others, a semiconductor to alter its mechanical, optical, and electrical properties. Among other tools, a beam-line ion implanter may be used. A block diagram of a conventional ion implanter is shown in FIG. 1. The conventional ion implanter may comprise an ion source 102 that may be biased by a power supply 104 and that generates ions. The ion source 102 is typically contained in a vacuum chamber known as a source housing (not shown). In the ion source 102, a filament (not shown) for emitting electrons may be disposed.

The ion implanter system 100 may also comprise a series of beam-line components, through which the ions 10 may pass. The series of beam-line components may include, for example, extraction electrodes 106, a 90° magnet analyzer 108, a first deceleration (D1) stage 110, a 70° magnet collimator 112, and a second deceleration (D2) stage 114. Typically, the wafer 116 may be mounted on a platen 118 that can be moved in one or more dimensions (e.g., translate, rotate, and tilt) by an apparatus, sometimes referred to as a "roplat" (not shown).

In operation, feed gas may be introduced into the ion source 102. Depending on the type of desired ions species, different types of feed gas may be used. For generating dopants for p-type doping, boron trifluoride ("$BF_3$") feed gas may be introduced to the ion source. For generating Hydrogen ("H") and Helium ("He") ions for cleaving process, $H_2$ and He feed gas may be introduced. For generating molecular p-type ions for low energy p-type doping, carborane ($C_xB_yH_z$) and decaborane ("$B_{10}H_{14}$") may be introduced. For generating dopants for n-type doping, phospine ("$PH_3$") or arsine ("$AsH_3$") feed gas may be introduced to the ion source.

After the feed gas is introduced, the filament may be powered to emit electrons. The electrons may then excite the feed gas into plasma containing charged and neutral particles, the particles including desired ions 10, unwanted ions, and neutrals. The desired ions 10 are extracted through an extraction aperture (not shown) of the ion source 102, manipulated into a beam-like state, and directed toward the wafer 116 by the beam-line components. Unwanted ions may also be extracted, and may be separated from the desired ions 10 through the use of a mass analyzer magnet.

Depending on the species contained in the feed gas, ions and neutrals in the ion source 102 may condense and coat the internal wall of the ion source 102, the extraction aperture, and/or the extraction electrode 106. If, for example, carborane or diborane feed gas is used, the internal wall of the ion source 102 may be coated with, among others, a film containing carbon or boron. The coating may change the electrical characteristics of the ion source 102 or even cause ion source 102 failure. In addition, the deposited layer may act as a source for contamination in subsequent implantation.

To prevent excess coating, the ion source 102 is cleaned periodically. After performing several ion implantations, the ion source 102 may be removed from the implantation system 100, taken apart, and cleaned. However, such a process does not adequately and efficiently clean the ion source 102. In addition, the cost of the cleaning process may be high, placing additional financial burden on semiconductor device manufacturers and, ultimately, consumers. As such, a new ion source and ion source cleaning method are needed.

SUMMARY

The problems of the prior art are overcome by the ion source system and method of cleaning the same disclosed herein. One or more heating units are placed in close proximity to the inner volume of the ion source, so as to affect the temperature within the ion source. In one embodiment, one or more walls of the ion source have recesses into which heating units are inserted. In another embodiment, one or more walls of the ion source are constructed of a conducting circuit and an insulating layer. In another embodiment, a heating unit replaces one or more walls of the ion source and is located near the liner.

By utilizing heating units near the ion source, it is possible to develop new methods of cleaning the ion source. Cleaning gas is flowed into the ion source, where it is ionized and/or become reactive species, either by the cathode, as in normal operating mode, or by the heat generated by the heating units. The cleaning gas is able to remove residue from the walls of the ion source more effectively due to the elevated temperature. In some embodiments, the temperature of the ion source may be modifying through control of the heating units, allowing different operating temperatures for normal operation and cleaning processes.

BRIEF DESCRIPTION OF THE DRAWINGS

In order to facilitate a fuller understanding of the present disclosure, reference is now made to the accompanying drawings. These figures should not be construed as limiting the present disclosure, but are intended to be exemplary only.

DETAILED DESCRIPTION

In the present disclosure, several embodiments of an ion source and a method for cleaning thereof are disclosed with reference to the accompanying drawings. For purpose of clarity, the disclosure is made in context to a term "substrate." Those of ordinary skill in the art will recognize that the substrate may be an electricity conducting, semiconducting, or insulating substrate, or a combination thereof.

For illustrative purpose, the present disclosure is made in context to a beam-line ion implantation system. However, those in the art will recognize that the present disclosure may be equally applicable to other systems that generate and/or manipulate particles, whether the particles are charged or neutral, and whether atomic, subatomic, or molecular particles. For example, the present disclosure may be equally applicable to plasma based systems including plasma doping ("PLAD") or Plasma Immersion Ion Implantation ("PIII") systems, plasma etching systems, and plasma enhanced chemical vapor deposition ("PECVD") systems. The present disclosure may also be equally applicable to systems including mass spectrometer system and molecular beam epitaxy (MBE) system. Further, the present disclosure may also be applicable to other chemical based process system including, for example, chemical vapor deposition ("CVD") systems and its variants.

Figure 1:
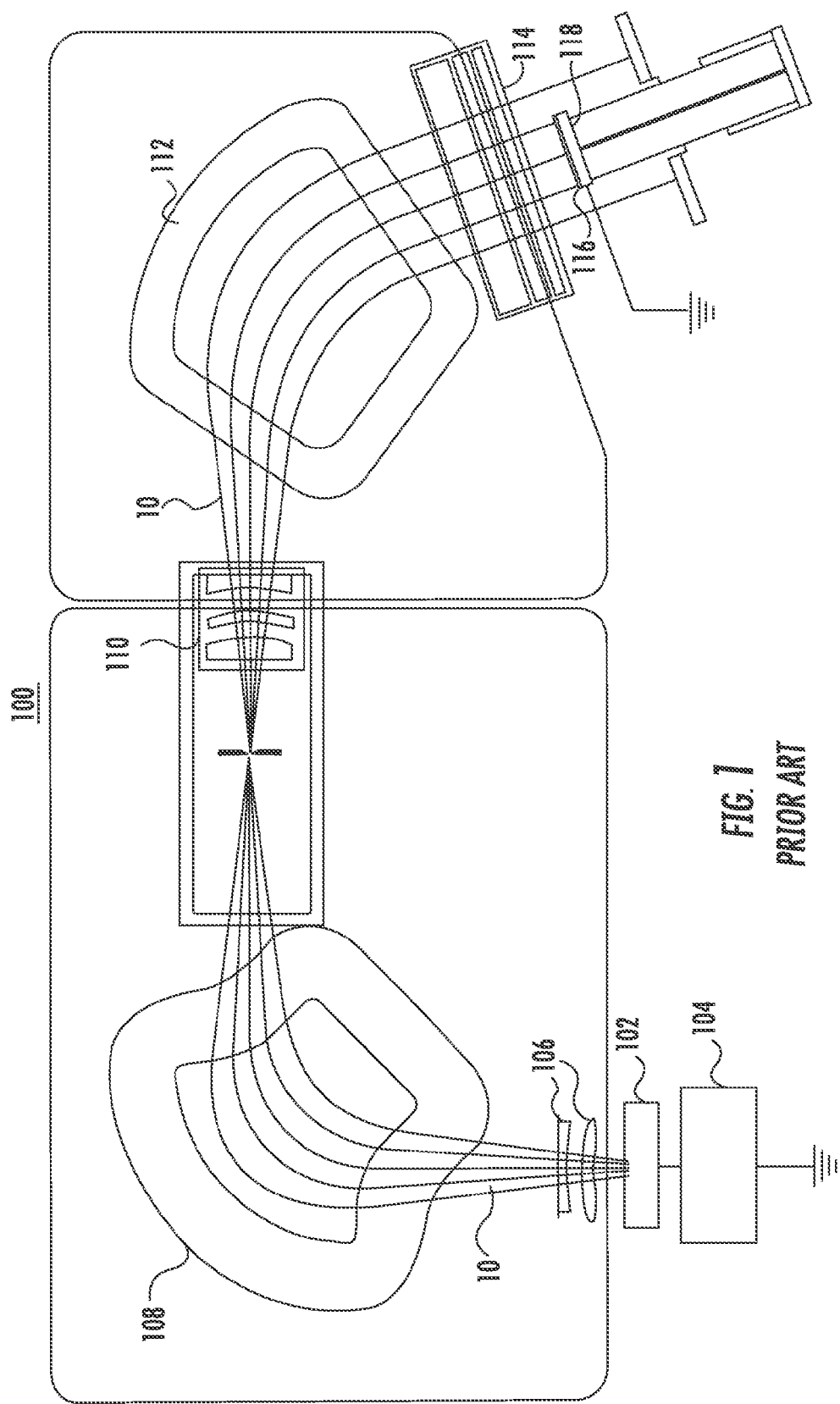
FIG. 1 is a block diagram illustrating a conventional ion implantation system.
Figure 2A:
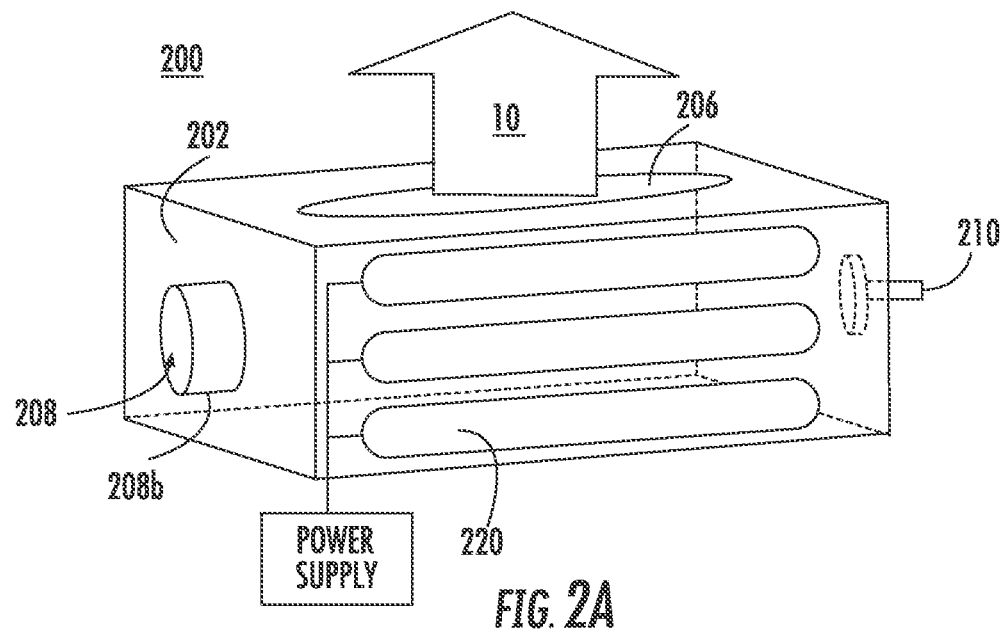
FIGS. 2A and 2B are block diagrams illustrating an ion source according to one embodiment of the present disclosure.
Figure 2B:
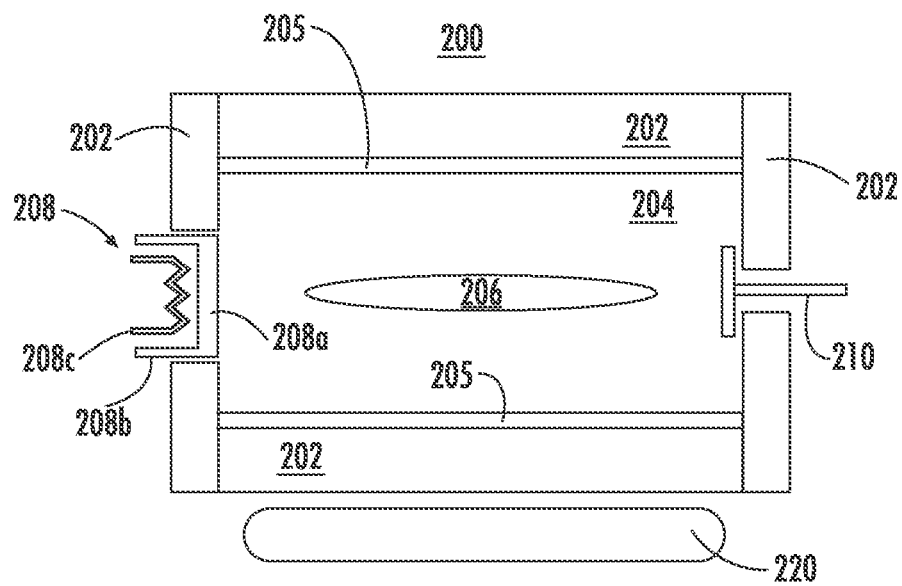

Referring to FIG. 2A, there is shown an ion source 200 according to one embodiment of the present disclosure. FIG. 2B shows a side view of the ion source 200. As illustrated in FIGS. 2A and 2B, the ion source of the present disclosure comprises a plurality of walls 202 defining a volume 204 where the ions 10 are generated. Although FIG. 2B illustrates that the ion source 200 may comprise a plurality of wall pieces, it is also contemplated that the ion source 200 may comprise a single, continuous piece defining the volume 204.

Near the internal surface of at least one wall 202, the surface facing the volume 204, a liner 205 may be disposed. Analogous to the wall 202 of the ion source 200, the liner 205 may be a single piece or multiple pieces. In the present disclosure, the liner 205 may be made from an inert material. In addition, the liner 205 may be made from a material capable of withstanding corrosive and reactive conditions associated with plasma. In the present embodiment, the liner 205 may be a tungsten liner or a graphite liner. In another embodiment, the liner 205 may be a tantalum ("Ta") liner. Yet in another embodiment, the liner 205 may be a molybdenum ("Mo") liner. On at least one of the walls 202 of the ion source 200, an extraction aperture 206 may be disposed.

In the present embodiment, the ion source may be a single mode ion source. As illustrated in FIGS. 2a and 2b, the single mode ion source 200 may comprise an indirectly heated cathode ("IHC") source 208 and a repeller 210 disposed on opposite ends of the ion source 200. However, it is also contemplated that the ion source 200 of the present disclosure may be a dual or multi-mode ion source. In the dual or multi-mode ion source, one or more IHC sources may be disposed in the position of the repeller 210. Accordingly, in the dual or multi-mode ion source, several IHC sources may be disposed on opposite ends of the ion source 200. The size of the IHCs in the dual or multi-mode ion source may be the same or different. In the dual or multi-mode ion source, one IHC source may be used as the IHC source for one type of ion implantation process, whereas another, different IHC source may be used as the IHC source for another type of ion implantation process. Different types of implantation processes may be those involving different types of ions or different energies. Examples of the dual or multi-mode ion source and its operation may be found in U.S. patent application Ser. No. 12/079, 978, which is incorporated in its entirety by reference.

Although the ion source 200 of the present disclosure may preferably be a source including the IHC source 208, it is also contemplated that the ion source 200 may be a Bernas type source, Freeman type source, or any other source capable of generating ions or other charged particles.

The indirectly heated cathode source 208, if present, may include a cathode 208a and a hollow skirt 208B disposed on the periphery of the cathode 208a. Optionally, the IHC 208 may include a support rod (not shown) that is positioned in a space defined by the cathode 208a and the hollow skirt 208b and that is coupled to the cathode 208a. Examples of ion source containing the optional support rod can be found in U.S. Pat. No. 7,138,768 and U.S. Pat. No. 7,276,847, each of which is incorporated in its entirety by reference. As shown in FIG. 2B, a filament 208c may be disposed in the space, and near the optional support rod, if the optional support rod is present.

Proximate to at least one of the walls 202, a heating unit 220 may be disposed. Any type of heating unit may be used. For example, the heating unit may be a heating unit that emits photons or phonons; a particle based heating unit that emits charged or neutral particles; a resistive based heating unit that emits heat converted from electrical current; a mechanical based heating unit that generates heat via friction; a chemical reaction based heating unit that generates heat via chemical reaction; other convective or conductive heating unit; or a combination thereof. In the present embodiment, the heating unit 220 may preferably be that which emits photons such as, for example, a halogen lamp or resistive heater. The heating unit 220 may be electrically coupled to a separate power supply or the power supply that powers the ion source, the IHC 208, and/or the repeller 210.

In the present embodiment, the heating unit 220 may be disposed on the outer surface of one of the walls 202. It is also contemplated that additional heat sources 220 may be provided near surfaces of other walls 202 of the ion source 200. If necessary, the heating unit 220 may be disposed around the extraction aperture 206, the IHC 208, the repeller 210, or a combination thereof.

When powered, the heating unit 220 may provide heat to the ion source 200. In addition, the heating unit 220 may maintain the temperature of the feed gas in the ion source 200 at high and uniform temperature level. High and uniform temperature level may be maintained whether the IHC source 208, the repeller 210, and/or the optional IHC is active or passive. High and uniform temperature level throughout the ion source 200 may enable more efficient and effective dissociation of the gas, as described below, to generate, for example, more reactive gas molecules for more effective source cleaning.

Figure 3A:
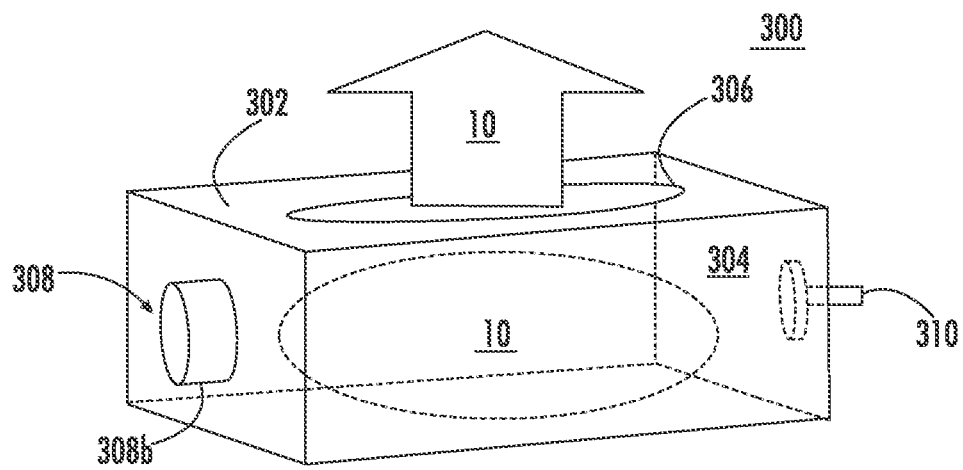
FIGS. 3A and 3B are block diagrams illustrating another ion source according to another embodiment of the present disclosure.
Figure 3B:
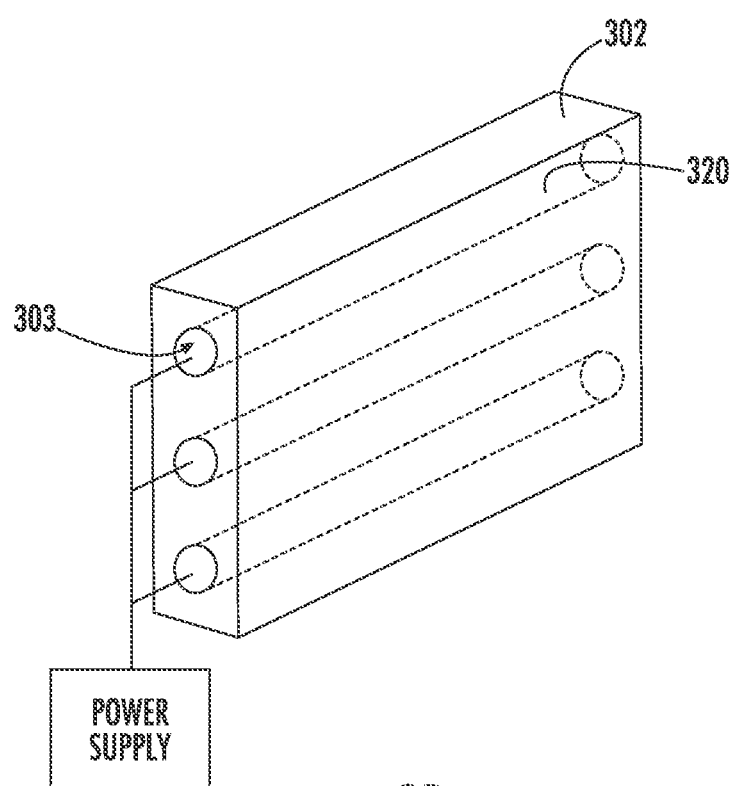

Referring to FIGS. 3A and 3B, there is shown another ion source 300 according to another embodiment of the present disclosure. Much like the ion source 200 of the earlier embodiment, the ion source 300 of the present embodiment may comprise a plurality of walls 302 defining a volume 304 where the ions 10 are generated; an extraction aperture 306; an IHC 308; and a repeller 310. Alternatively, the ion source 300 may be a dual mode or multi-mode ion source comprising a second or additional IHC disposed opposite to the IHC 308. In addition, a liner (not shown) may be disposed between the volume 304 and the internal surface of the wall 302 of the ion source 300.

The indirectly heated cathode 308 may be similar to the IHC 208 of the earlier embodiment. In particular, the IHC 308 of the present embodiment may comprise a cathode (not shown) and a hollow skirt 308b disposed on the periphery of the cathode. In the area defined by the cathode 308a and the hollow skirt 308b, a filament (not shown) and an optional support rod (not shown) may be positioned. For purpose of clarity, a detailed description of similar features will be omitted.

Referring to FIG. 3B, at least one wall 302 of the ion source 300 may comprise at least recess 303. At least one heating unit 320 may be positioned within the recess 303. The recess 303 may be a through hole in that it has holes on both ends of the wall and passes across the entirety of the wall 302. Alternatively, the recess may only be in a portion of the wall 302 and may not have holes on both ends of wall 302. The heating unit 320, similar to the heating unit 220 of the earlier embodiment, may be, for example, a heating unit that emits photons or phonons; a particle based heating unit that emits charged or neutral particles; a resistive based heating unit that emits heat converted from electrical current; a mechanical based heating unit that generates heat via friction; chemical reaction based heating unit that generates heat via chemical reaction; other convective or conductive heating unit; or a combination thereof. In the present embodiment, a halogen lamp, a filament that emits photons, or a biased filament that also emits electrons may be preferred.

By including at least one recess 303 in at least one wall 302 of the ion source 300, the heating unit 320 of the present embodiment may efficiently and effectively apply heat to the ion source 300. As known in the art, many of the heating units are multi-directional, emitting heat in multiple directions. By including the heating unit 320 into the walls 302 of the ion source 300, at least a portion of the heat emitted away from the volume 304, the volume 304 where ions 10 are generated, may be captured and redirected toward the volume 304. In addition, by positioning the heating unit 320 within the walls 302 of the ion source 300, the heating unit 320 may be shielded from conditions outside of the ion source 300 that may cool the unit 320. As such, heat loss may be reduced.

Referring to FIG. 4A-4E, there is shown another ion source 400 according to another embodiment of the present disclosure. Much like the ion sources 200 and 300 of the earlier embodiments, the ion source 400 of the present embodiment may comprise an IHC 408 and a repeller 410. In addition, the ion source 400 may be a dual mode or multi-mode ion source comprising a second or additional IHCs, instead of the repeller 410, disposed opposite to the IHC 408.

Figure 4A:
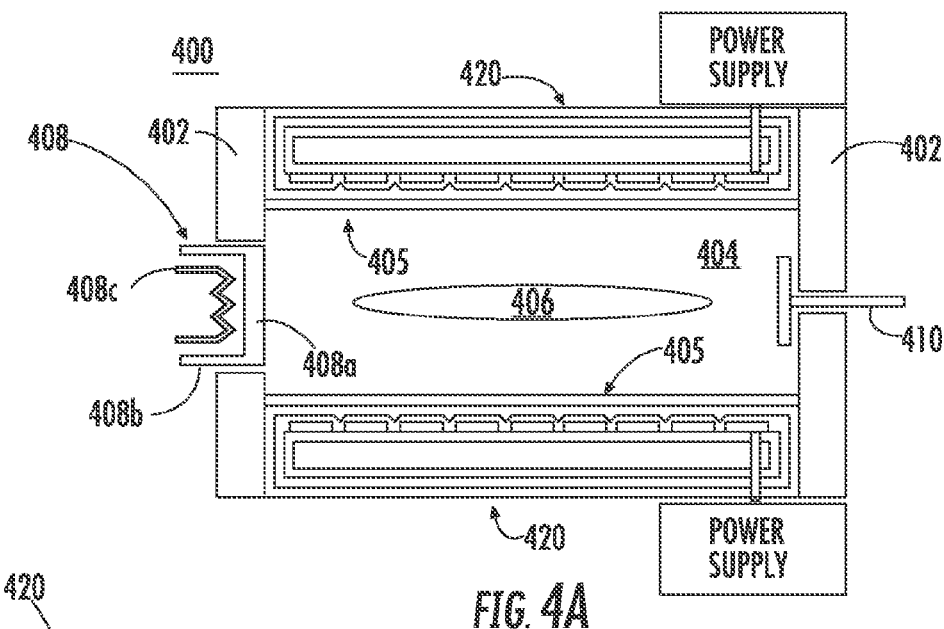
FIGS. 4A, 4B, 4C, 4D, and 4E are block diagrams illustrating another ion source according to another embodiment of the present disclosure.
Figure 4B:
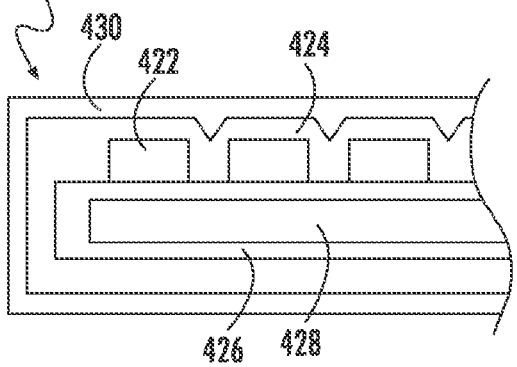

Referring to FIGS. 4A and 4B, the ion source 400 of the present embodiment may also comprise a plurality of walls 402 defining a volume 404 where the ions 10 are generated. In addition, an optional liner 405 may be positioned proximate to the volume 404, between the walls 402 and the volume 404. Further, an extraction aperture 406 may be disposed on one of the walls 402. For purpose of clarity, a detailed description of similar features will be omitted.

In the present embodiment, at least one of the walls 402 may also be a heating unit 420 that provides heat to the ion source 400. The heating unit 420 of the present embodiment may comprise a circuit 422 surrounded by one or more electricity insulating layers 424 and 426. In one embodiment, the circuit 422 may be a circuit made from graphite. However, in another embodiment, the circuit 422 may be a circuit made from another electricity conducting material such as tungsten.

One or more insulating layers 424 and 426 surrounding the circuit 422 may be ceramic layers 424 and 426. Although FIG. 4B illustrates multiple insulating layers 424 and 426, it is within the scope of the present disclosure that the single insulating layers surrounds the circuit 422.

In the present embodiment, the insulating layers 424 and 426 may be pyrolitic boron nitride ("PBN") layers 424 and 426. However, it is contemplated that the insulating layers 424 and 426 may be made from some other insulating material.

In choosing the materials for the circuit 422 and the insulating layers 424 and 426, it may be prudent to consider the mechanical and thermal properties of the materials. The materials for the circuit 422 and the insulating layer 424 and 426 may preferably be chosen from those capable of maintaining their structural integrity at high temperature, for example, at or above 1000° C.

Referring to FIG. 4B, there is shown a detailed cross sectional view of the heating unit 420 of the present embodiment. The heating unit 420 may comprise the circuit 422; a first insulating layer 424 disposed on the circuit 422; a second insulating layer 426, on which the circuit 422 is disposed; and a base 428. Further, the heating unit 420 may optionally comprise a graphite layer 430 that surrounds the first insulating layer 424.

In the present embodiment, the base 428 of the heating unit 420 may be a graphite base. However, it is also contemplated that the base 428 may be made from another type of conductor, semiconductor, or insulator, or a combination thereof.

Figure 4C:
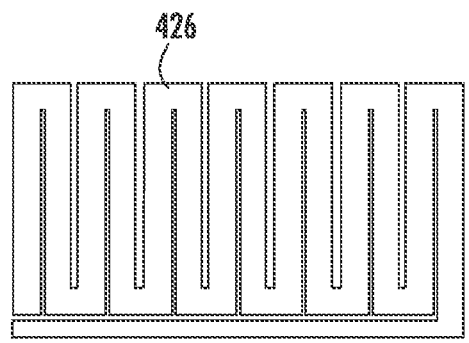
Figure 4D:
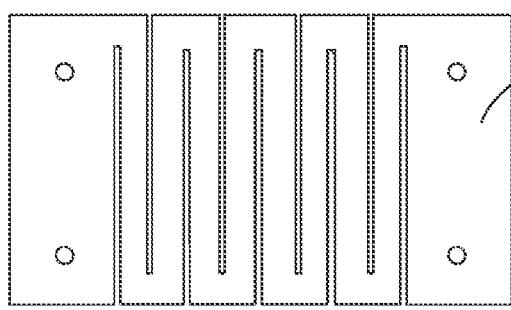
Figure 4E:
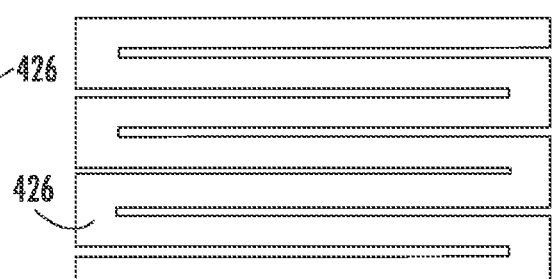

Referring to FIG. 4C-E, there is shown plan views of several examples of the circuit 422. As illustrated in each figure, the circuit 422 may preferably have a coil-like or serpentine-like shape with multiple windings. Preferably, one end of the circuit 422 may be connected to a first voltage potential, such as a power supply and another end may be connected to a second voltage potential, such as ground (not shown).

As illustrated in FIG. 4C-E, it may be preferable to minimize the spacing between the windings such that the circuit 422 covers substantially the entire surface of the second insulating layer 426. In the process, the circuit 422 may provide heat to substantially the entire portion of the volume 404 of the ion source 400. However, those of ordinary skill in the art should recognize that the spacing between windings may preferably be wide enough to prevent the current from, for example, tunneling through the spacing. While these figures show the insulating layer 426 as having the same general contour as the underlying circuit 422, this is not required. The insulating layer 426 may be formed so as to cover the circuit 422 on its inner side, while being smooth on its outer side.

When powered, current may flow from the first voltage potential, such as a power supply, to the second voltage potential, such as ground, via the windings of the circuit 422. By disposing the first and second insulating layers 424 and 426 on the circuit 422, and by sufficiently spacing the windings, the flow of the current may be limited to the circuit 422. The circuit 422 may act as a resistive heating unit, converting the current to heat and emitting heat toward the volume 404 where ions 10 are generated.

One advantage of the heating unit 420 of the present embodiment is that the circuit 422 may provide uniform heating to the ion source 400, whether the IHC 408 or the repeller 410, or the optional IHCs are powered. In addition, by disposing the circuit 422 toward the volume 404, the heating unit 420 may emit heat in one direction. As such, heat loss may be minimized.

Figure 5A:
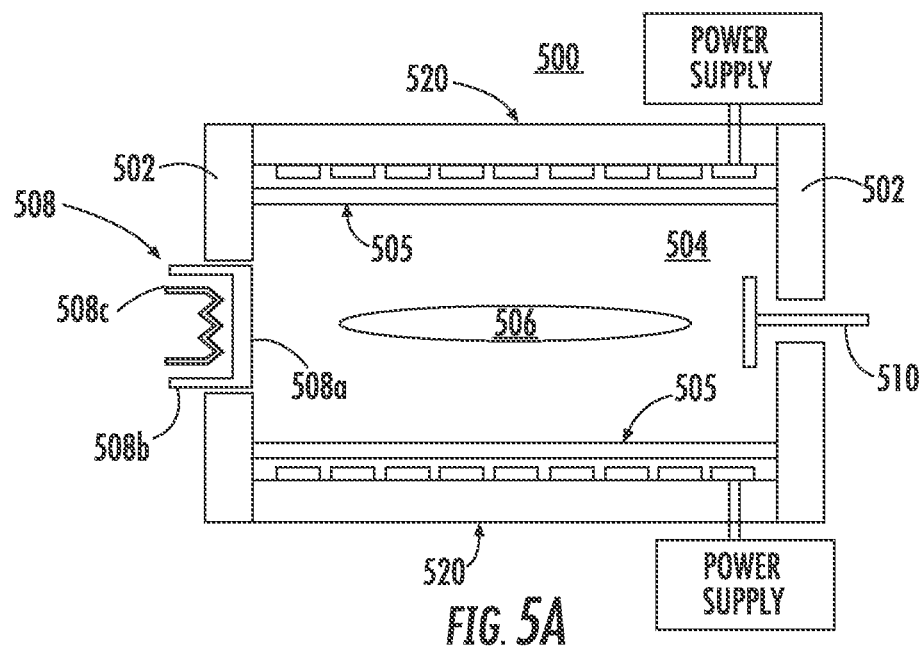
FIGS. 5A, 5B, 5C, 5D, and 5E are block diagrams illustrating another ion source according to another embodiment of the present disclosure.

Referring to FIG. 5A-5E, there is shown another ion source 500 according to another embodiment of the present disclosure. Much like the ion sources 200-400 of the earlier embodiments, the ion source 500 of the present embodiment may comprise an IHC 508 and a repeller 510. Similar to the ion source 400 of the earlier embodiment, the ion source 500 may be a dual mode ion source comprising a second IHC (not shown) disposed opposite to the IHC 508. Referring to FIG. 5A, the ion source 500 of the present embodiment also comprises a plurality of walls 502 defining a volume 504 where the ions 10 are generated. In addition, an optional liner 505 may be positioned between the walls 502 and the volume 504. Further, an extraction aperture 506 may be disposed on one of the walls 502. For purpose of clarity, a detailed description of similar features will be omitted.

Figure 5B:
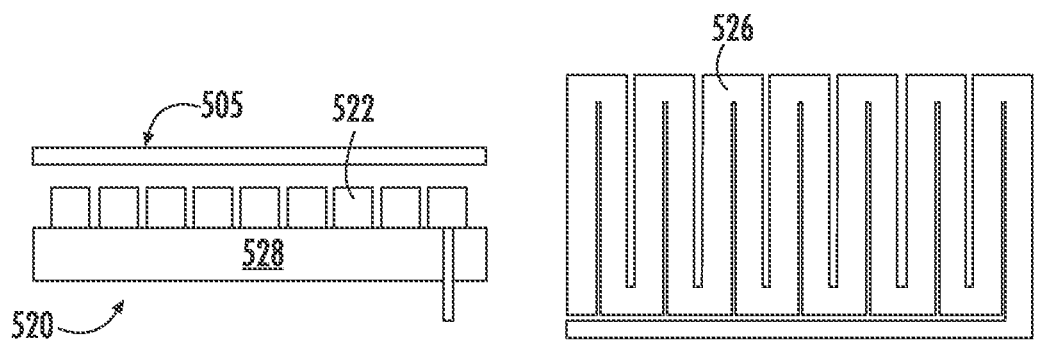

Referring to FIG. 5B, a detailed cross sectional view of the heating unit 520 is provided. In the present embodiment, at least one of the walls 502 may be a heating unit 520 of the ion source 500. The heating unit 520 of the present embodiment may comprise an electricity conducting circuit 522 disposed on a base 528. In one embodiment, the circuit 522 may be a graphite circuit 522. However, in another embodiment, the circuit 522 may be a circuit made from another electricity conducting material, such as tungsten. In some embodiments, the base 528 may be made from an electricity conducting material. In other embodiments, the base 528 of the heating unit 520 may be made from an electricity insulating material. If the base 528 is made from an electricity conducting material, it may be preferable to position a layer of electricity insulating material (not shown) between the circuit 522 and the base 528.

Similar to the liners of the earlier embodiments, the liner 505 may preferably be made from an inert material capable of withstanding reactive and corrosive conditions associated with plasma. If the liner 505 is made from electricity conducting material, the liner 505 may be, for example, graphite, tungsten, tantalum, or molybdenum. The liner 505 may be spaced apart from the circuit 522 such that the space between the liner 505 and the circuit 522 may act as an insulator, preventing current from flowing to the liner 505. Alternatively, an electricity insulating layer (not shown) may be disposed between the liner 505 and the circuit 522. In some embodiments, the liner 505 may be omitted. In such embodiments, the circuit 522 may be made from a liner material (e.g. graphite) and the circuit 522 may also act as the liner.

Figure 5C:
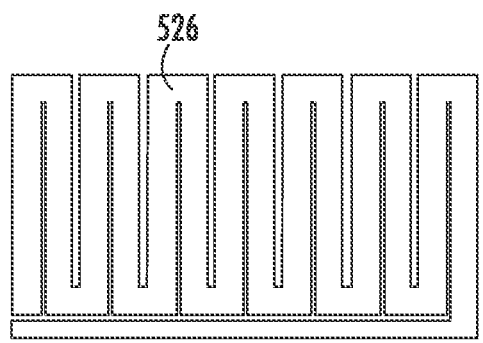
Figure 5D:
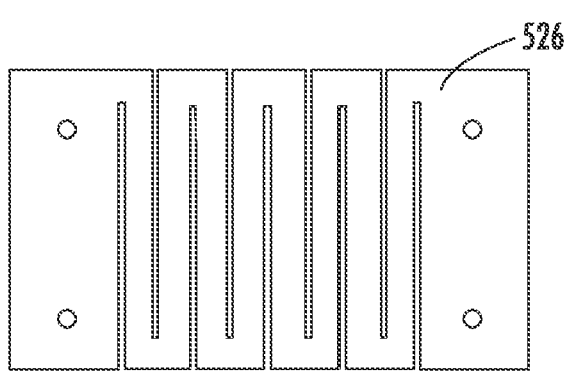
Figure 5E:
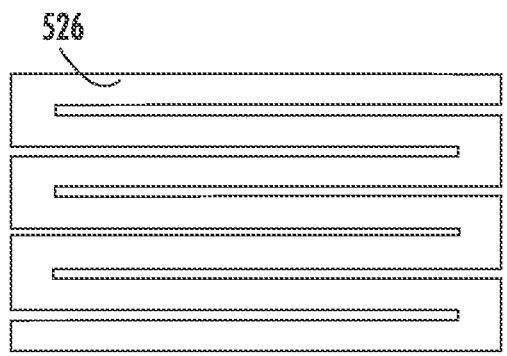

Referring to FIG. 5C-5E, plan views, the circuit 522 may preferably have a coil-like or serpentine-like shape with multiple windings. One end of the circuit 522 may preferably be connected to a first voltage potential, such as a power supply and another end may be connected to a second voltage potential, such as ground (not shown). As illustrated in FIG. 5C-E, it may be preferable to minimize the spacing between the windings such that the circuit 522 may cover substantially the entire surface of the base 528.

When powered, current may flow from the power supply to the ground via the windings of the circuit 522. The circuit 522 may act as a resistive heating unit, converting the current to heat and emitting heat toward the volume 504 where ions 10 are generated.

One advantage of the heating unit 520 of the present embodiment is that the circuit 522 may provide uniform heating to the ion source, even if the IHC 508, the repeller 510 or the optional IHC remains passive. In addition, by disposing the circuit 522 near the inner volume 504 or within the ion source 500, the heat generated by the heating unit 520 may be directed toward the inner volume 504. As such, heat loss may be minimized.

Hereinafter, operation of the ion sources 200-500 of the present disclosure is disclosed with reference to FIG. 2-5. In operation, one or more types of feed gas are provided to the ion source 200-500. Examples of feed gas may include $H_2$, He, carborane, diborane, $BF_4$, $GeF_4$, $SiF_4$, $Si_2F_6$, $BF_3$, $SF_6$, $S_2F_6$, $SF_4$, $AsH_3$, and $PH_3$.

The indirectly heated cathode 208-508 of the ion source 200-500 may then be powered to ionize the feed gas. In particular, the filament 208c-508c of the IHC 208-508 may be biased to excite the cathode 208a-508a into emitting heat and/or electrons via thermionic emission. Meanwhile, the repeller 210-510 may be biased and maintained at the same voltage as the cathode. Maintaining the repeller 210-510 and the cathode at the same voltage may electrostatically confine the electrons within the volume 204-504 of the ion source. If the ion source 200-500 is a dual mode or multi-mode ion source comprising additional IHCs, the additional IHC may also be biased at the same voltage to that of the cathode 208a-508a.

Electrons emitted by the IHC 208-508 and confined within the volume 204-504 of the ion source 200-500 may excite the feed gas into plasma containing the ions 10 of desired species. Depending on the type of applications, the ions 10 of the desired species may be atomic species or, alternatively, molecular species. The ions 10 generated are then extracted from the ion source 200-500 via the extraction aperture 206-506. Thereafter, the extracted ions 10 may be directed toward a substrate to be processed, positioned downstream of the beam-line components.

While ionizing the feed gas, the heating unit 220-520 may also be activated such that the heating unit 220-520, along with the indirectly heated cathode 208-508, may maintain the temperature of the ion source 200-500 uniformly. For hydride applications (e.g. $PH_3$), it may be desirable to maintain the temperature at about 800° C. or above. The heat may prevent the generated ions 10 from neutralizing or condensing to form deposits on the source chamber wall and/or the extraction electrodes. Formation of such deposits may be undesirable as the deposits may cause unstable source operation, glitching, uniformity degradation and source failure.

In the application of heavier molecular species, including but not limited to carborane (such as $C_2B_{10}H_{12}$) and diborane ($B_2H_6$), the cathode may operate at lower power so that these heavy molecular species do not break into smaller species. However, lower cathode power causes lower temperatures within the ion source, which may cause condensation and deposition. The heating unit 220-520 may be used to supplement or augment the heat provided by the cathode 208-508 so as to maintain the temperature above a first predetermined temperature to prevent the molecular ion species 10 in the ion source 200-500 from neutralizing and condensing. Other heavier molecular species may include carborane ($C_xB_yH_z$); any molecule containing boron, hydrogen and another atom or chain of atoms (e.g. $X_yB_xH_z$); decaborane, octadecaborane, any other borohydride; any molecule containing germanium and hydrogen (e.g. $Ge_xH_y$); and carbon containing molecules such as ethane, propane, pyrene and bibenzyl.

Generally, the conventional IHC ion sources rely only on the cathode for both ionization and heating. In such ion sources, the ions 10 positioned near cathode may be at a desirable temperature to prevent condensation and formation of deposits. The ions 10 or gas molecules located away from the cathode (e.g. near the extraction aperture or extraction electrode), however, may be at a temperature lower than the desired temperature, and may condense to form deposits. Accordingly, conventional IHC sources may have heavy deposit at regions away from the cathode (e.g. near the extraction aperture or extraction electrode). Simply raising the temperature of the cathode in conventional IHC ion sources, however, may lead to overheating near the cathode. Such overheating may be undesirable for the application of molecular species, as the overheating may promote breaking down of the molecular species into smaller species.

In the present disclosure, the ion source 200-500 provides a heating unit 220-520 that is decoupled from the cathode and independently controlled.

In some embodiments, current applied to the circuit 222-522 of the heating unit 220-520 may be varied. By varying the current, it is possible to control the heat emitted by the circuit and therefore the temperature of the ion source 200-500. A variable power supply may be used to provide this type of temperature control. In some embodiments, a temperature sensor may be provided in the ion source 200-500 or at the wall 202-502. In this way, the current provided by the power supply may be determined via a closed control loop. In another embodiment, the current supplied by the power supply is varied based on the type of species that is being ionized. Accordingly, temperature in different regions of the ion source 200-500 may be independently controlled. Thus, uniform temperature in the ion source 200-500, if desired, may be provided. Overheating and/or underheating at different regions of the ion source 200-500 may be avoided.

In addition to the heating unit 220-520, the ion source 200-500 of the present disclosure may also efficiently clean and/or prevent deposition of unwanted coating. In particular, one or more types of cleaning gas may be introduced to the ion source 200-500. The cleaning gas may be gas containing a reactive species, reactive in its ionized or neutral form, capable of preventing formation of the deposits or removing the formed deposits. For example, the cleaning gas, in its ionized or neutral form, may be an etchant capable of etching the coating formed on the ion source and preventing accumulation of the coating. In another example, the cleaning gas, in its ionized or neutralized form, may be capable of chemically reacting with the ions or neutrals of the feed gas to prevent formation or deposition of coating on the internal walls of the ion source 200-500. Examples of the cleaning gas may include $H_2$; chlorine containing gas such as $Cl_2$; fluorine containing gas such as $CF_4$, $NF_3$, $BF_3$ and $SF_6$; nitrogen containing gas such as air, $NF_3$, $NO$, $N_2O$, $NO_3$, $N_2O_3$, $NO_3F$, $NOBr$, $NOF$, and $NO_2F$; oxygen containing gas such as $O_2$, $O_3$. Those of ordinary skill in the art will recognize that other types of cleaning gas may be also used. In addition, those of ordinary skill in the art will recognize that several examples of the cleaning gas may also function as the feed gas or vice versa.

In one embodiment of the present disclosure, the cleaning gas may be introduced to the ion source 200-500 before and/or after the introduction of the feed gas. In another embodiment, the cleaning gas and the feed gas may be introduced to the ion source 200-500 simultaneously. Yet in another embodiment, the cleaning gas may be introduced before, during, and after the introduction of the feed gas. If the cleaning gas is introduced more than once, the same type of the cleaning gas need not be introduced each time. Different types of the cleaning gas may be introduced. By introducing the cleaning gas into the ion source 200-500 prior to introducing the feed gas, the cleaning gas may remove coating from prior ion implantation processes. By introducing the cleaning gas into the ion source 200-500 after introducing the feed gas, the cleaning gas may remove coating formed by ionizing the feed gas. And, by introducing the cleaning gas and the feed gas simultaneously, the cleaning gas may prevent the formation of the coating and/or may remove the formed coating.

In one embodiment of the present disclosure, the cleaning gas may be introduced to the ion source 200-500 as the substrate is being ion implanted. In other words, the cleaning process may occur simultaneously with the ion implantation process. In another embodiment, the cleaning process may occur before and/or after the implantation process, when the ion implantation process is not being performed. In the latter embodiment, the cleaning gas may be introduced as a maintenance process. Yet in another embodiment, the cleaning gas may be introduced before, after, and during ion implantation process.

When introducing the cleaning gas, it may be preferable to introduce the cleaning gas at high pressure. In addition, maintaining the pressure level within the ion source 200-500 at high pressure level may be desirable. Maintaining high pressure level may be achieved by continuously introducing gas at high pressure level and compensating for a portion escaping through the extraction aperture 206-506. Alternatively, the extraction aperture 206-506 may be blocked. One example of latter configuration may be found in a U.S. patent application Ser. No. 12/143,247, which is incorporated in its entirety by reference.

In addition to the pressure level, it may also be preferable to maintain the temperature level in the ion source 200-500 at high temperature level. Hereinafter, operation to maintaining the temperature of the ion source 200-500 at high temperature level will be disclosed. First, the cleaning gas may be introduced to the ion source 200-500. As noted earlier, the cleaning gas may be introduced with or without the feed gas. Thereafter, at least one of the IHC 208-508, the repeller 210-310, and the heating unit 220-520 may be powered. If the ion source 200-500 is a dual mode or multi-mode ion source comprising the additional IHCs, the additional IHCs may also be biased at the same voltage to the IHC 208-508 emitting electrons. At least one of the IHC 208-508, the repeller 210-510 (or the additional IHC), and the heating unit 220-520 may raise the temperature of the cleaning gas contained in the ion source 200 and 300 and excite the cleaning gas. In one embodiment of the present disclosure, the cleaning gas may be excited without being ionized. In another embodiment, the cleaning gas may be excited and converted into plasma by the electrons emitted from the IHC 208-508.

If a variable power supply is utilized, the temperature of the heating unit 220-520 may be varied as a function of the operation being performed. For example, it may be desirable to maintain a certain temperature range while feed gas is being ionized. However, a second temperature range, such as a higher temperature range, may be beneficial during a cleaning process.

The cleaning gas, in its excited state, may etch the coating deposited on the surface of the ion source 200-500 or may chemically react with the feed gas to prevent the formation of the coating. Thereafter, the cleaning gas, in its natural or chemically reactive form, may be extracted from the ion source 200-500. The extracted cleaning gas, however, may be prevented from reaching the substrate by one of the beam-line components of the ion implantation system. Alternatively, a vacuum pump, for example, a turbo-molecular pump, (not shown) may be provided near to the extraction aperture 206-506, and the vacuum pump may evacuate the cleaning gas from the ion implantation system.

One specific method used to clean the ion source 200-500 will be described. After ion implantation has been completed, the flow of feed gas to the ion source 200-500 is ceased. The voltage applied to the extraction electrodes 106 may be disabled, so that ions are not drawn from the ion source 200-500. A cleaning gas may then be introduced into the ion source 200-500. In some embodiments, this cleaning gas is introduced at high pressure, as described above. The IHC 208-508 is then powered so as to produce plasma of the cleaning gas. The repeller 210-510 may also be powered in this embodiment. This action creates ions of the cleaning gas, which may be effective in removing film from the walls 202-502. To further enhance the cleaning process, the heating units 220-520 may be powered to increase the temperature within the ion source. Such an increase in temperature may increase the reactivity of the cleaning gas. The temperature within the ion source 200-500 during the cleaning process may be the same or different than that used during the ion implantation process.

Several embodiments of an ion source and a method for in situ cleaning the ion source are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the heating unit described in the present disclosure may be activated along with the indirectly heated cathode. By activating the heating unit and the indirectly heated cathode at the same time, the heating unit may maintain the temperature of the ion source uniform and above which the feed gas may condense into deposits to prevent formation of deposits. In another example, the heating unit may be activated during cleaning stage, when the indirectly heated cathode is turned off. The heating unit may raise the temperature of the ion source and beak up any deposits formed on the wall of the ion source, thereby cleaning the ion source. Those of ordinary skill in the art will also recognize that the feed gas and the cleaning gas may be introduced to the ion source together or alone. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of extending a lifetime of an ion source, the method comprising:
   introducing a feed gas containing a desired molecular species to a chamber of the ion source;
   activating an indirectly heated cathode of the ion source for ionizing the feed gas and generating ions of the desired molecular species;
   activating a heating unit disposed proximate at least one wall of the ion source; and
   maintaining a temperature of the chamber above 800° C. so as to reduce condensation of the ions of the desired molecular species on walls of the ion source.

2. The method of claim 1, wherein said heating unit is chosen from a group consisting of a lamp and a resistive heater.

3. The method of claim 1, wherein the desired molecular species comprises carborane.

4. The method of claim 1, wherein the desired molecular species comprises a hydride comprising boron.

5. The method of claim 1, wherein the desired molecular species comprises germanium and hydrogen.

6. The method of claim 1, wherein the desired molecular species comprises phosphine.

7. The method of claim 1, wherein the desired molecular species comprises ethane, propane, pyrene or bibenzyl.

8. The method of claim 1, further comprising monitoring a temperature within the chamber and activating the heating unit based on the monitored temperature.

9. The method of claim 1, wherein the ion source comprises a plurality of walls and the heating unit is disposed in a recess in a wall of the ion source.

10. The method of claim 1, wherein the ion source comprises a plurality of walls and at least one of the walls is a heating unit.

11. The method of claim 1, further comprising:
   introducing cleaning gas to the ion source so as to generate reactive cleaning gas species, wherein the cleaning gas comprises at least one of hydrogen containing gas; chlorine containing gas; fluorine containing gas; nitrogen containing gas or oxygen containing gas.

* * * * *